US 6,224,719 B1

(12) United States Patent
Westwood

(10) Patent No.: US 6,224,719 B1
(45) Date of Patent: May 1, 2001

(54) SPUTTERING METHOD OF MANUFACTURING FE-AI-N-O LAMINATED FILMS USING $N_2O$ AS THE REACTIVE GAS

(75) Inventor: John David Westwood, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/311,238

(22) Filed: May 13, 1999

(51) Int. Cl.[7] .............................. C23C 14/34; G11B 5/127
(52) U.S. Cl. ........................ 204/192.2; 29/603.14
(58) Field of Search ............... 204/192.12, 192.15, 204/192.2; 29/603.07, 603.08, 603.11, 603.13, 603.14; 360/120, 126; 428/336

(56) References Cited

U.S. PATENT DOCUMENTS

| | | | |
|---|---|---|---|
| 4,923,748 | * 5/1990 | Yasunaga et al. | 428/336 |
| 4,969,962 | 11/1990 | Watanabe et al. | 148/306 |
| 5,108,837 | * 4/1992 | Mallary | 360/126 |
| 5,182,690 | * 1/1993 | Katori et al. | 360/120 |
| 5,290,629 | 3/1994 | Kobayashi et al. | 428/332 |
| 5,302,469 | 4/1994 | Sugenoya et al. | 428/694 |
| 5,438,747 | * 8/1995 | Krounbi et al. | 360/120 |
| 5,473,492 | 12/1995 | Terunuma et al. | 360/128 |
| 5,503,943 | * 4/1996 | Sano et al. | 204/192.2 |
| 5,617,275 | 4/1997 | Ogura et al. | 360/113 |
| 5,621,595 | * 4/1997 | Cohen | 360/126 |
| 5,736,013 | * 4/1998 | Ranjan et al. | 204/192.2 |
| 5,768,073 | * 1/1993 | Nepela et al. | 360/126 |

* cited by examiner

*Primary Examiner*—Nam Nguyen
*Assistant Examiner*—Gregg Cantelmo
(74) *Attorney, Agent, or Firm*—Grar Cary Ware & Freidenrich; Ervin F. Johnston

(57) ABSTRACT

A shield and/or pole piece layer for a magnetoresistive (MR) head made of a high moment Fe—Al—N—O laminated film is disclosed. The Fe—Al—N—O laminated film is manufactured using $N_2O$ as the reactive gas, making a laminated film that has a high intrinsic anisotropic ($H_K$) and can better withstand the processing fields employed during the various processing and annealing steps in the construction of the head. Accordingly, the magnetic domains of the first shield layer, the second shield layer and/or the pole piece layers do not change position from a desired parallel position to the ABS. By maintaining their parallel position, applied fields during the operation of the head, such as from the write head or the media, do not move the domain walls around to cause Barkhausen noise.

24 Claims, 15 Drawing Sheets

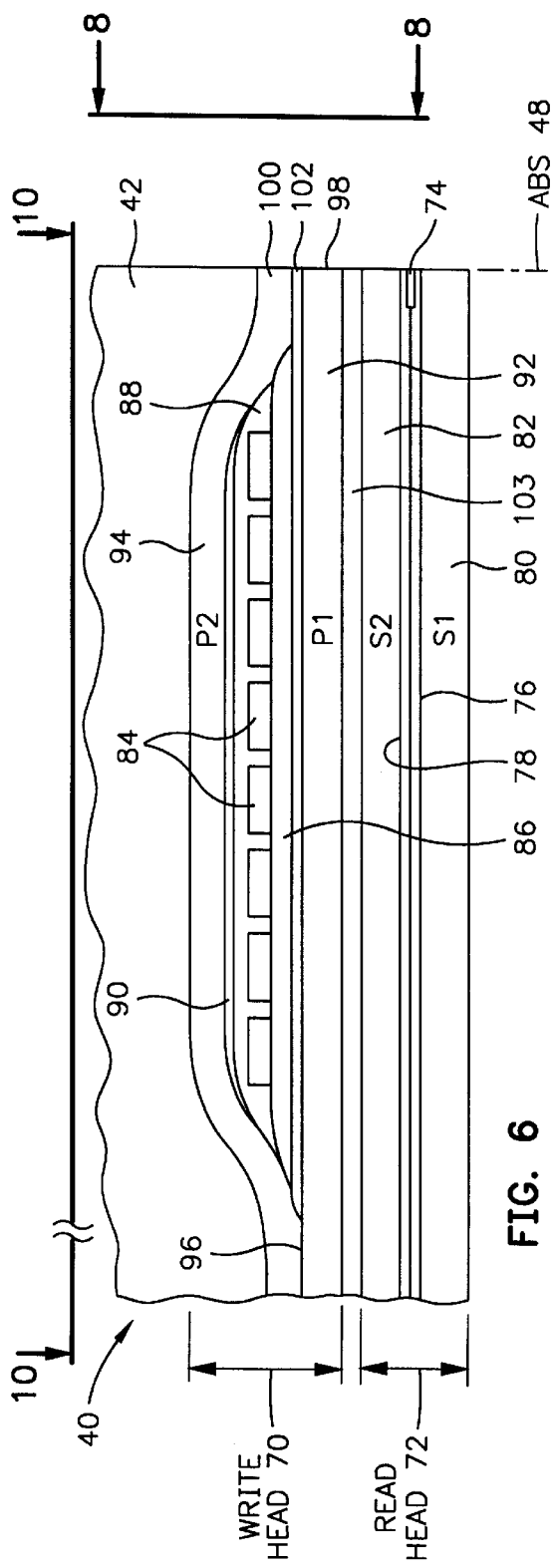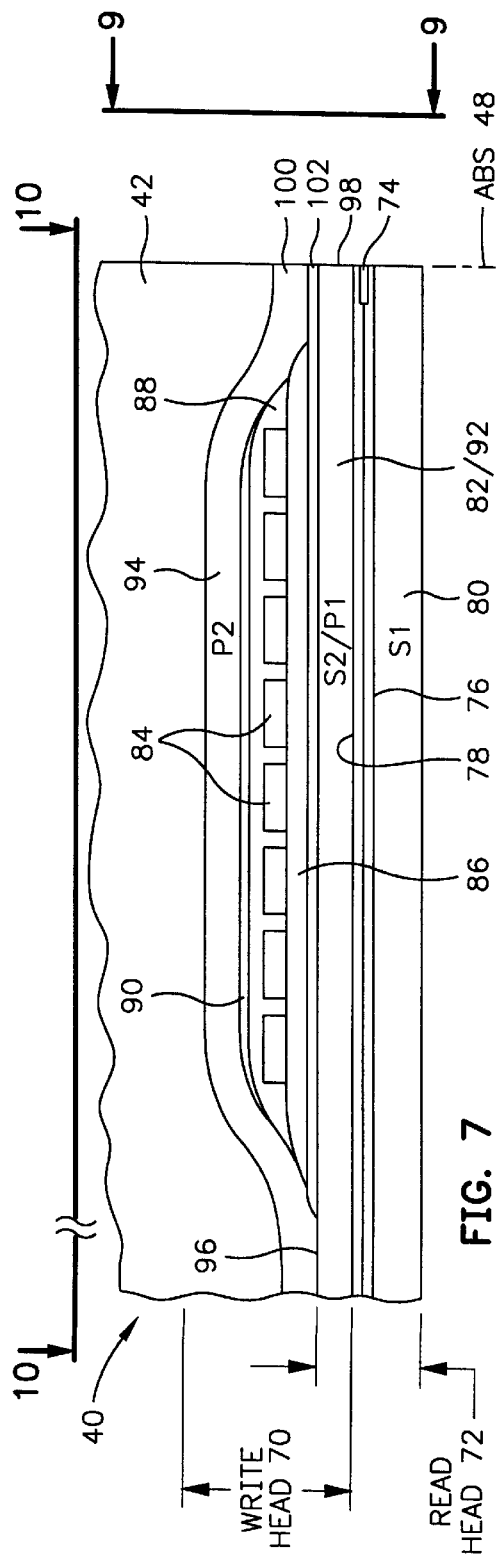

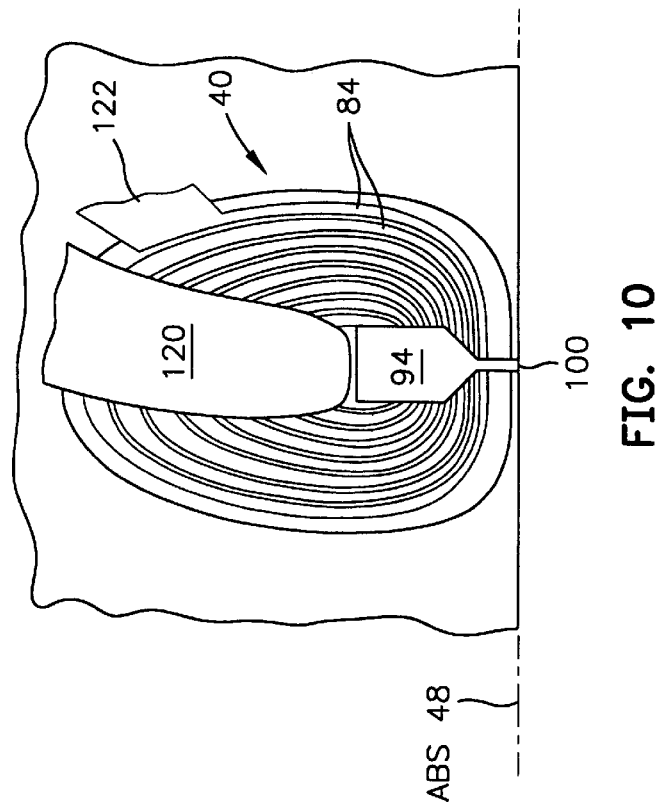
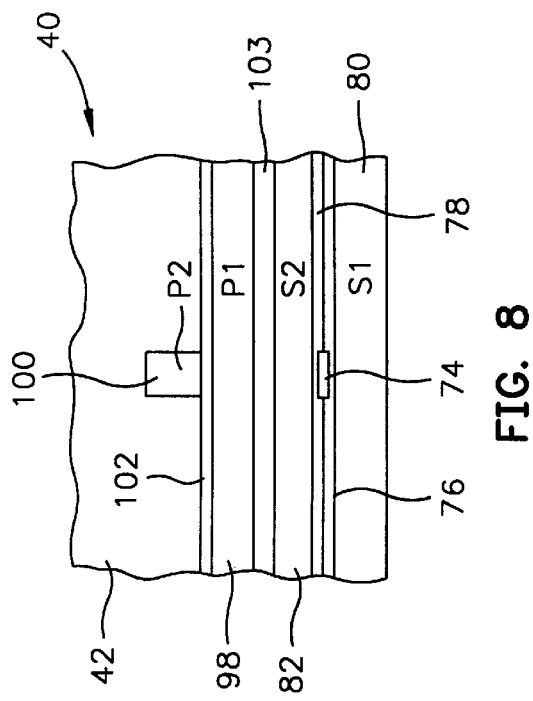

(ABS)

BH Loops of Fe-Al(2at%)-N-O Laminate
Film Annealed on the Hard axis (18Å Alumina/1000Å Fe-2at%Al-N-O)$_{3X}$ /25Å Alumina
Hard axis anneal 3x 232°C, 400 min 2 Oe/div

FILM B&C

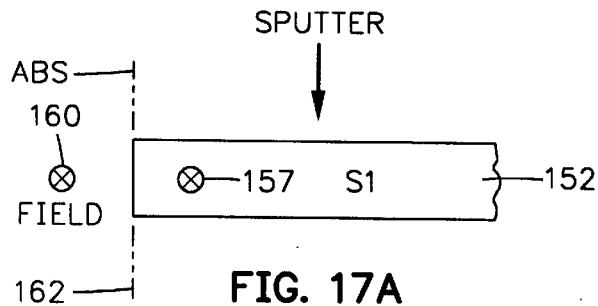
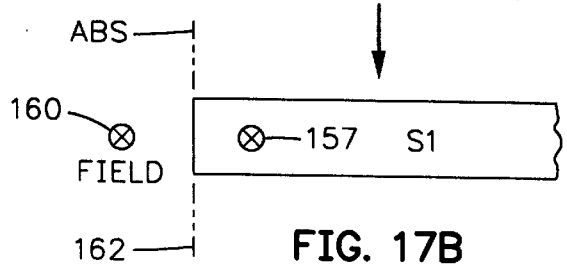
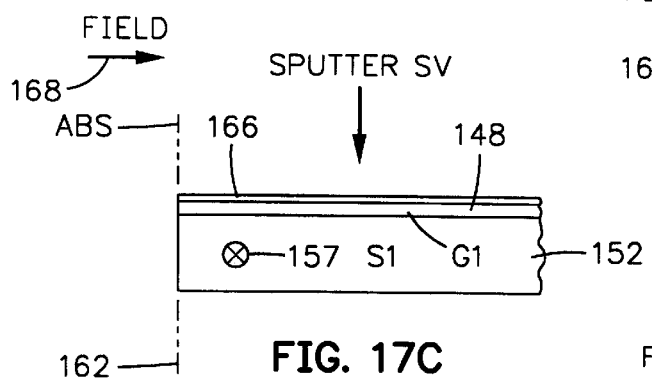
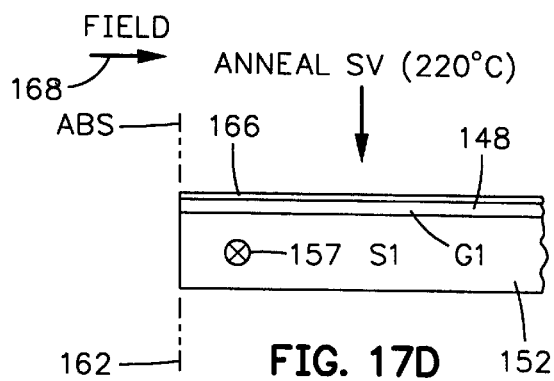
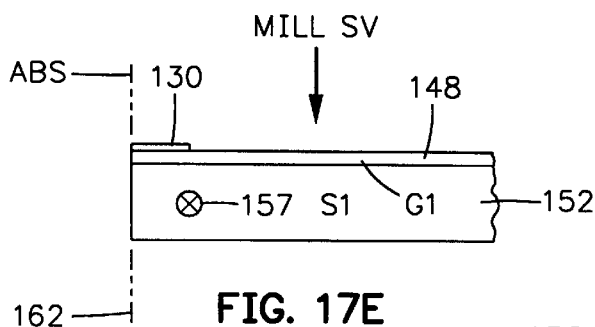
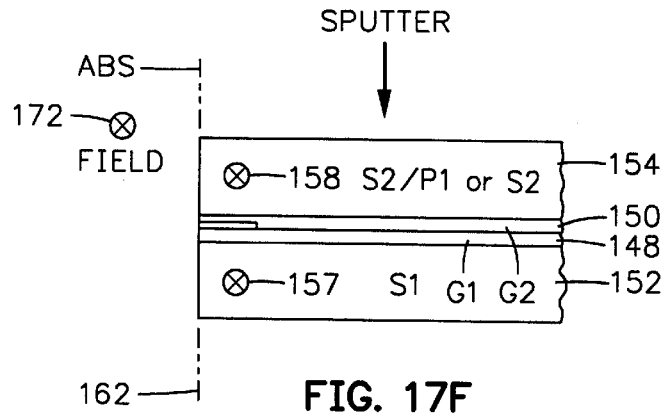

Fe-Al-N-O AFTER HARDBAKE
ANNEALING OR RESETTING
IN THE PRESENCE OF A FIELD
PERPENDICULAR TO THE ABS

APPLIED FIELDS

SPUTTERING METHOD OF MANUFACTURING FE-AI-N-O LAMINATED FILMS USING N₂O AS THE REACTIVE GAS

BACKGROUND OF THE INVENTION

1. Field of the Invention

The present invention relates to high moment material for a shield or pole piece layer in a magnetic head, such as a giant magnetoresistive (GMR) head and, more particularly, to the manufacturing of high moment Fe—Al—N—O laminated film using $N_2O$ as the reactive gas for the shield or pole piece layer in the magnetic head.

2. Description of the Related Art

The heart of a computer is an assembly that is referred to as a magnetic disk drive. The magnetic disk drive includes a rotating magnetic disk with write and read heads that are suspended by a suspension arm above the rotating disk. An actuator swings the suspension arm, placing the write and read heads over selected circular tracks on the rotating disk. The write and read heads are directly mounted on a slider that has an air bearing surface (ABS). The suspension arm biases the slider into contact with the surface of the disk when the disk is not rotating. When the disk rotates, air is swirled by the rotating disk adjacent the ABS of the slider, causing the slider to ride on an air bearing a slight distance from the surface of the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in insulation layers (insulation stack), the insulation stack being sandwiched between first and second pole piece layers. A gap is formed between the first and second pole piece layers by a nonmagnetic gap layer at the air bearing surface (ABS) of the write head. The pole piece layers are connected at a back gap. Current conducted to the coil layer induces a magnetic field into the pole pieces that fringes across the gap between the pole pieces at the ABS. The fringe field, or the lack thereof, writes information in tracks on moving media, such as in circular tracks on a rotating disk.

In recent read heads, a spin valve sensor is employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer, and a free layer. First and second leads are connected to the spin valve sensor for conducting a sense current therethrough. The magnetization of the pinned layer is pinned perpendicular to an air bearing surface (ABS) of the head and the magnetic moment of the free layer is located parallel to the ABS but free to rotate in response to external magnetic fields. The magnetization of the pinned layer is typically pinned by exchange coupling with an antiferromagnetic layer. A spin valve sensor is sometimes referred to as a giant magnetoresistive (GMR) sensor. When a spin valve sensor employs a single pinned layer it is referred to as a simple spin valve.

There a number of materials that may be used in the construction of the magnetic head, the most common being NiFe. GMR wafer processing requires annealing in a magnetic field parallel to the hard axis of the shields (of the read head) and the poles (of the write head) for optimal performance of the GMR sensor. In the present process, there are typically at least three high temperature anneals that are performed, for both hardbake and pole pieces. These anneals are typically performed at around 232° C. for 400 minutes. These hard axis anneals are known to reduce the anisotropy field, $H_k$ of plated NiFe. Other materials considered for write head and shield materials, such as FeN, FeAlN, FeTaN, FeZrN and FeRuN, reduce or even switch $H_k$ in conventionally processed laminated films. By careful control of the substrate bias, sputter pressure, nitrogen content and other conditions, films can be fabricated which retain magnetic anisotropy after hard axis annealing, but in all cases there is still some decrease in $H_k$ and increase in $H_{ch}$ after hard axis annealing. This loss of intrinsic anisotropy causes unfavorable domain structures to form, which in turn causes instability in the read sensor in a read head shield application or reduction in high frequency permeability in a write head pole application.

There are shield layers (S1, S2) and pole piece layers (P1, P2) in close proximity of the read sensor. Because of the proximity, it is important that the layers be magnetically stable. In order to achieve this, the shield or pole layers are formed by plating or sputter deposition in the presence of a magnetic field that is parallel to the ABS in the plane of the shield or pole layer. The field orients the easy axis (e.a.) of the shield or pole layer in the direction of the field, namely parallel to the ABS and in the plane of the shield or pole layer. This orientation also means that the magnetic domains in the shield or pole layer in the vicinity of the sensor are also aligned with their longitudinal axes parallel to the ABS in the plane of the shield or pole layer. It is important that these domains retain their orientation as formed and not move around when subjected to extraneous fields such as fields from the write head or fields from the rotating magnetic disk. When these magnetic domains move, noise is generated which is referred to in the art as Barkhausen noise. This noise seriously degrades the read signal of the read head. Further, if the magnetic domains do not come back to their original position, the shield or pole layer exerts a differently oriented field on the free layer of the spin valve sensor. This changes the magnetic bias on the free layer causing read signal asymmetry.

Nickel iron (NiFe), with a composition of approximately $Ni_{81}Fe_{19}$ (wt. %), has been typically employed for the shield or pole layers. Nickel iron (NiFe) is a soft magnetic material that provides good shielding of the spin valve sensor from magnetic fields except within the read gap where signals are sensed by the sensor. Nickel iron (NiFe) also has near zero magnetostriction so that after lapping the head to form the ABS there is near zero stress induced anisotropy. Unfortunately, however, nickel iron (NiFe) has a low intrinsic magnetic anisotropy ($H_K$). Intrinsic magnetic anisotropy is the amount of applied field required to rotate the magnetic moment of the layer 90 degrees from an easy axis orientation. The intrinsic magnetic anisotropy of nickel iron (NiFe) is 2–5 oersteds (Oe). After the first shield layer (S1) and second shield layer (S2) layer are formed, they are subjected to unfavorable magnetic fields that are required in subsequent processing steps. The insulation layers of the insulation stack are hard baked in the presence of a magnetic field, that is directed perpendicular to the ABS, for the purpose of maintaining the magnetic spins of the antiferromagnetic pinning layer in the spin valve sensor oriented in a direction perpendicular to the ABS. After completion of the head, the head is subjected to an additional anneal in the presence of an external magnetic field directed perpendicular to the ABS for the purpose of resetting the spins of the pinning layer perpendicular to the ABS. These annealing steps reduce the anisotropy field of nickel iron (NiFe) to very low values of 0–1 Oe.

The field typically employed for maintaining the spins of the pinning layer during hard bake of the insulation stack is about 1500 Oe and the field for resetting the spins of the pinning layer after completion of the head is about 13 kG. Because of the low intrinsic magnetic anisotropy of a nickel iron (NiFe) shield layer, the aforementioned anneals in subsequent processing can cause the easy axis and the magnetic domains of the shield layer to switch their orientation such that they are no longer parallel to the ABS. The magnetic field present in these anneals reduces or destroys the intrinsic anisotropy field that was created in the nickel iron (NiFe) when it was originally formed and may create an anisotropy field perpendicular to the ABS. This is a very unfavorable position for magnetic domains of a shield layer. When the shields are subjected to perpendicular fields from the write head during the write function or perpendicular fields from the rotating magnetic disk the magnetic domains will move. This causes Barkhausen noise which degrades the read signal and causes a potential change in biasing of the spin valve sensor which results in read signal asymmetry.

In general, it is desirable to minimize the reduction of $H_k$ that occurs in hard axis annealing, and particularly desirable that this can be done while simultaneously achieving low hard axis coercivity, $H_{ch}$, and near zero magnetostriction, $\lambda$, for the process conditions used for the GMR wafers. Accordingly, there is a strong felt need for a material for the first shield layer (S1), the second shield (S2) and first and second pole piece layers (P1 & P2) that will remain stable after being subjected to heat and magnetic fields employed in subsequent process steps.

SUMMARY OF THE INVENTION

I have replaced the nickel iron (NiFe), typically employed in the first and second shield layers or the pole piece layers, with a Fe—Al—N—O laminated film, which is preferably in the composition range Fe—Al(2at %)—N—O. I have found that the Fe—Al—N—O laminated films that are fabricated using $N_2O$ as the reactive gas have an intrinsic magnetic anisotropy ($H_K$) such that it does not suffer a significant reduction in anisotropy field during subsequent processing of the head and that the films retain sufficient anisotropy field ($H_K$) to overcome possible unfavorable stress induced anisotropy due to shield shape and air bearing surface formation. This means that the magnetic domains of a shield layer return to an easy axis orientation, parallel position to the ABS after being rotated by an extraneous field.

An object of the present invention is to provide a magnetically stable first shield, second shield and/or pole piece layers for a magnetic head.

Another object is to provide a first shield, second shield or pole piece layers with magnetic domains that do not change their orientation parallel to the ABS after being subjected to processing fields during the construction of the head.

A further object is to provide a material for first shield, second shield and/or pole piece layers of a magnetic head that has a higher intrinsic anisotropy field ($H_K$) to withstand the reduction in anisotropy field ($H_K$) that occurs as a result of annealing steps in the construction of the magnetic head after constructing the shield layers.

Still another object is to provide a material for a first shield, second shield and/or pole piece layers that has near zero magnetostriction and retains an intrinsic magnetic anisotropy after completing the head fabrication process that is greater than any stress induced anisotropy that may be created during processing.

Still another object is to provide a method of making a magnetically stable first shield, second shield and/or pole piece layers.

Other objects and advantages of the invention will become apparent upon reading the following description taken together with the accompanying drawings.

BRIEF DESCRIPTION OF THE DRAWINGS

FIG. 6 is a partial view of the slider and a piggyback magnetic head as seen in plane 6—6 of FIG. 2;

FIG. 7 is a partial view of the slider and a merged magnetic head as seen in plane 7—7 of FIG. 2;

FIG. 8 is a partial ABS view of the slider taken along plane 8—8 of FIG. 6 to show the read and write elements of the piggyback magnetic head;

FIG. 9 is a partial ABS view of the slider taken along plane 9—9 of FIG. 7 to show the read and write elements of the merged magnetic head;

FIG. 10 is a view taken along plane 10—10 of FIGS. 6 or 7 with all material above the coil layer and leads removed;

FIGS. 17A–17H are side views of portions of layers that are constructed in a merged MR head;

DESCRIPTION OF THE PREFERRED EMBODIMENTS

Magnetic Disk Drive

Figure 1:
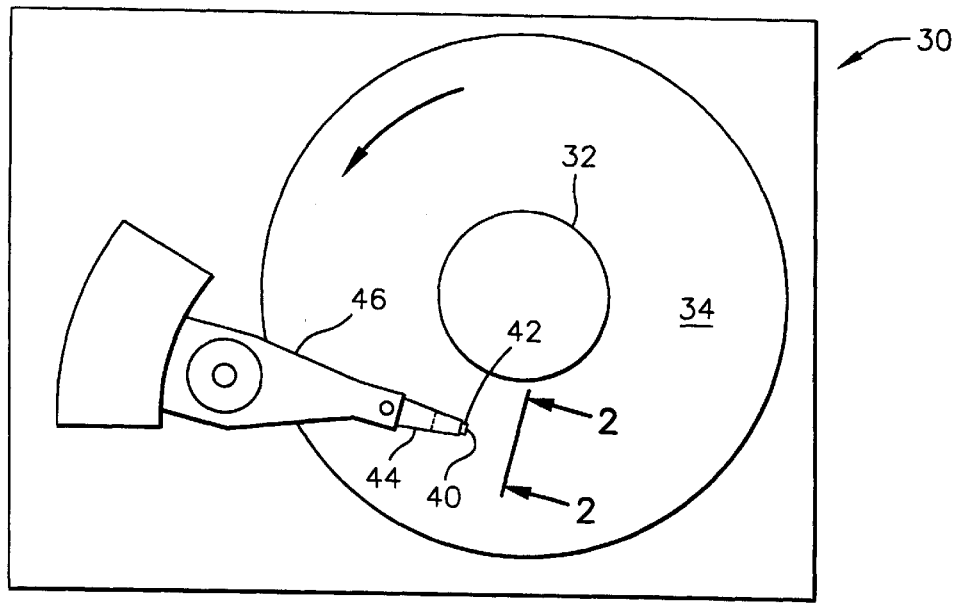
FIG. 1 is a plan view of an exemplary magnetic disk drive.
Figure 2:
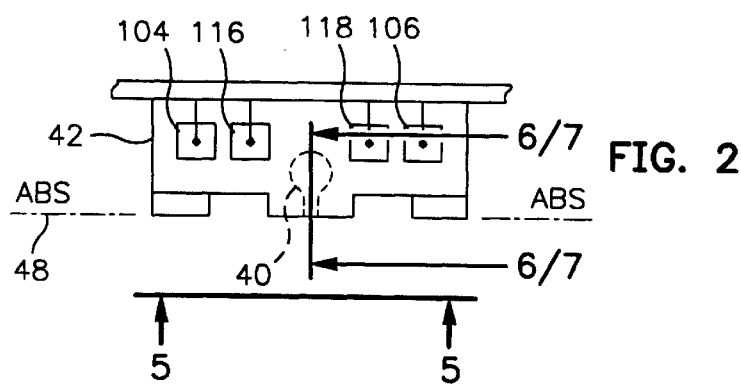
FIG. 2 is an end view of a slider with a magnetic head of the disk drive as seen in plane 2—2.
Figure 3:
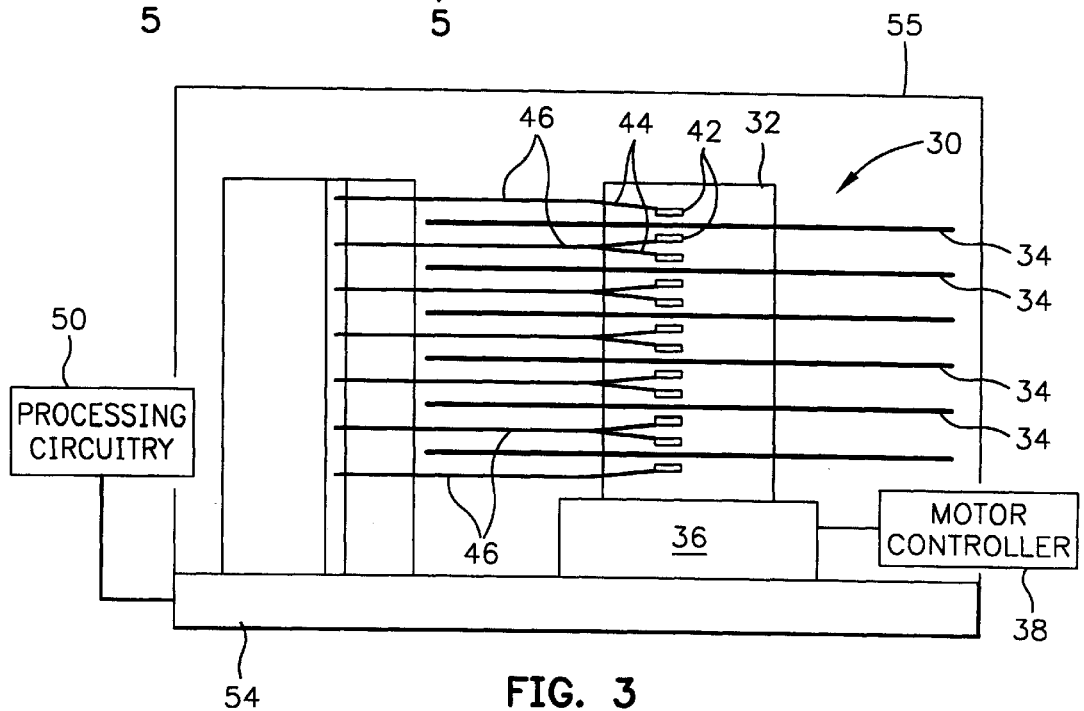
FIG. 3 is an elevation view of the magnetic disk drive wherein multiple disks and magnetic heads are employed.
Figure 4:
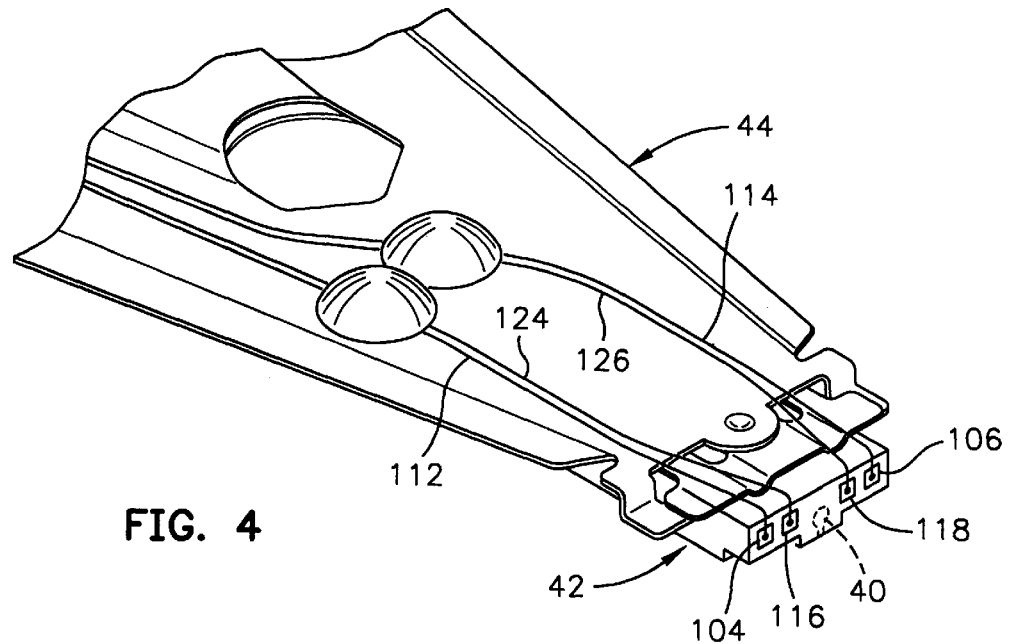
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a motor 36 that is controlled by a motor controller 38. A combined read and write magnetic head 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted to a suspension 44. The components described hereinabove may be mounted on a frame 54 of a housing 55, as shown in FIG. 3.

Figure 5:
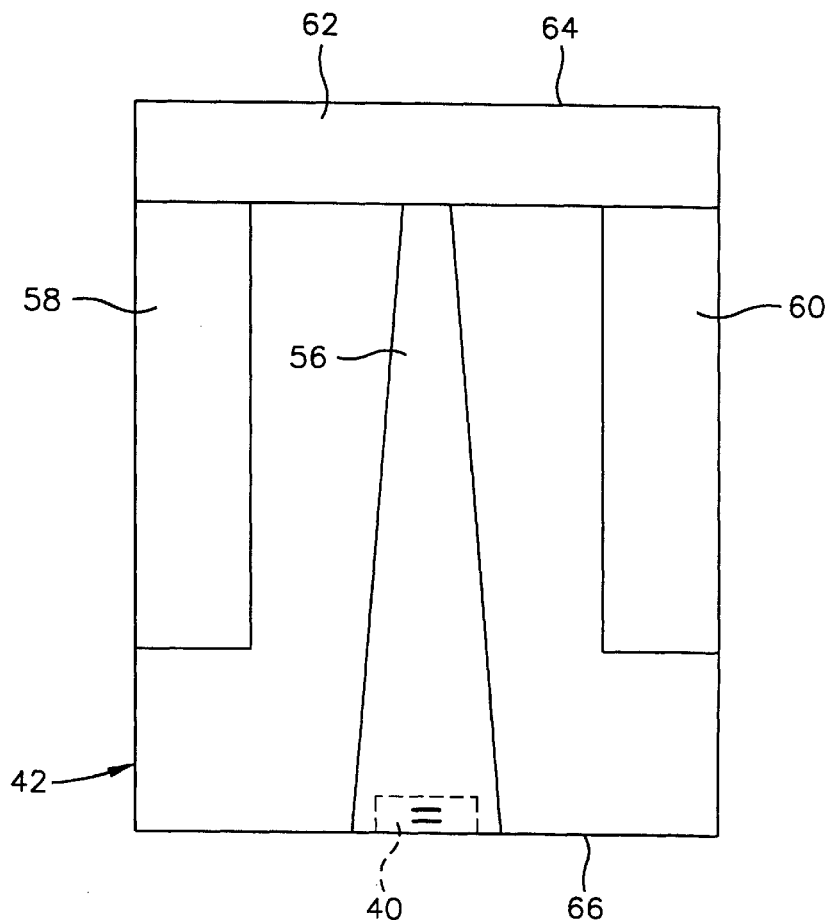
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

FIG. 6 is a side cross-sectional elevation view of a piggyback magnetic head 40, which includes a write head portion 70 and a read head portion 72, the read head portion employing an AP pinned spin valve sensor 74. FIG. 8 is an ABS view of FIG. 6. The spin valve sensor 74 is sandwiched between nonmagnetic electrically insulative first and second read gap layers 76 and 78, and the read gap layers are sandwiched between ferromagnetic first and second shield layers 80 and 82. In response to external magnetic fields, the resistance of the spin valve sensor 74 changes. A sense current $I_S$ conducted through the sensor causes these resistance changes to be manifested as potential changes. These potential changes are then processed as readback signals by the processing circuitry 50 shown in FIG. 3.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. An insulation layer 103 is located between the second shield layer 82 and the first pole piece layer 92. Since the second shield layer 82 and the first pole piece layer 92 are separate layers this head is known as a piggyback head. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 10) to leads 124 and 126 on the suspension.

FIGS. 7 and 9 are the same as FIGS. 6 and 8 except the second shield layer 82 and the first pole piece layer 92 are a common layer. This type of head is known as a merged magnetic head. The insulation layer 103 of the piggyback head in FIGS. 6 and 8 is omitted.

Figure 11:
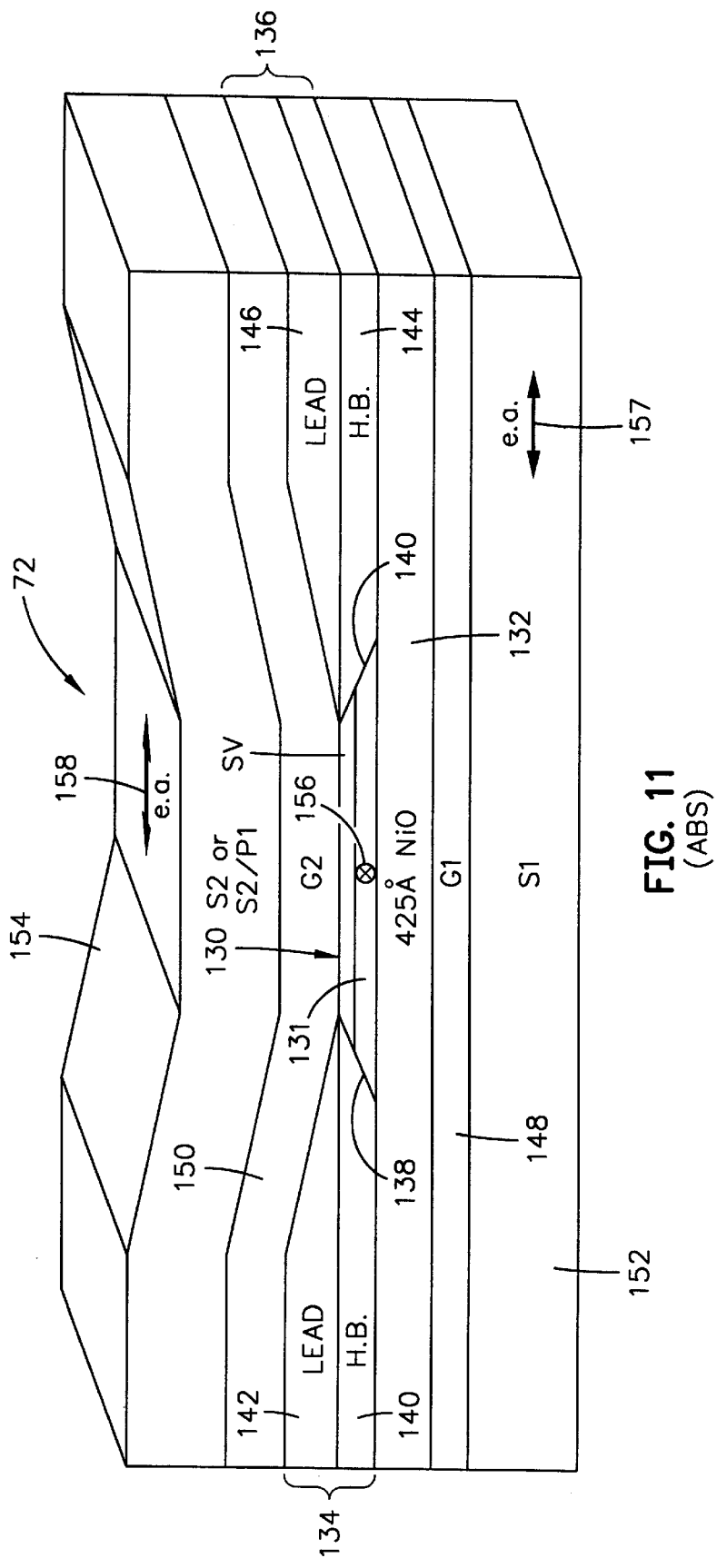
FIG. 11 is an isometric ABS illustration of a read head which employs a pinned spin valve (SV) sensor.

FIG. 11 is an isometric ABS illustration of the read head 72 shown in FIGS. 6 or 7. The read head 72 has a spin valve sensor 130 which is located on an antiferromagnetic (AFM) pinning layer 132. The spin valve 130 has an antiferromagnetic (AFM) pinned layer 131 that has a magnetic moment pinned by the magnetic spins of the pinning layer 132 in a direction perpendicular to the ABS, such as into the paper as shown by $\bigotimes$. The AFM pinning layer may be 425 Å of nickel oxide (NiO). First and second hard bias and lead layers 134 and 136 are connected to first and second side edges 138 and 140 of the spin valve sensor. This connection is known in the art as a contiguous junction and is fully described in commonly assigned U.S. Pat. No. 5,018,037 which is incorporated by reference herein. The first hard bias and lead layer 134 includes a first hard bias layer 140 and a first lead layer 142 and the second hard bias and lead layer 136 includes a hard bias layer 144 and a lead layer 146. The hard bias layers 140 and 144 produce magnetic fields that extend longitudinally through the spin valve sensor 130 for stabilizing its magnetic domains. The AFM pinning layer 132, the spin valve sensor 130 and the first and second hard bias and lead layers 134 and 136 are located between nonmagnetic electrically insulative first and second gap layers 148 and 150. The first and second gap layers 148 and 150 are, in turn, located between a first shield layer (S1) 152 and a second shield first pole piece (S2) layer 154 (as shown in the piggyback head configuration of FIG. 6). The second shield layer may also be the first pole piece layer (S2/P1) in a merged head (as shown in the merged head configuration of FIG. 7).

After completion of the magnetic head 40 shown in FIGS. 6 or 7, it is important that the magnetic moment 156 of the pinned layer 131 be oriented perpendicular to the ABS, such as into the paper as shown by $\hat{x}$ in FIG. 11. It is also important that the easy axes 157 and 158 of the first shield layer 152 and the second shield layer 154, respectively, be oriented parallel to the ABS as shown. This means that the elongated magnetic domains of the layers 154 and 156 will likewise be oriented parallel to the ABS, which is a stable condition of the domains when exposed to applied fields from the write head 70 in FIGS. 6 or 7 and magnetic fields from the rotating magnetic disk 34 in FIG. 1. Unfortunately, the magnetic domains of the shield layers 152 and 154 may become disoriented when subjected to various temperatures and fields during the construction of the magnetic head. The various processing temperatures and fields and operational fields exerted on the first and second shield layers 152 and 154 will be described hereinafter.

The Invention

I have found that films constructed from Fe—M—N—O have improved resistance to hard axis annealing, where M=B, Al, Si, P, Ti, Zr, Hf, V, Nb, Ta, Cr, Mo, Ru, Y, Ga, In, Ge or Sn. In the preferred embodiment, M=Al, with Fe—Al—N—O being the material described in the present application. Wherever Fe—Al—N—O is referred to it should be understood that it may include any of the Fe—M—N—O elements referenced above so that all claims existing in the application would be set forth in one document. The Fe—Al—N—O film of the present invention can be made to retain magnetic anisotropy after hard axis annealing and have more stable domain structures than Fe—M—N films. The Fe—Al—N—O films are ideal for shield layers (S1, S2), pole layers (P1, P2), combined second shield/pole layer (S2/P1), bilayer P1 and yoke applications due to higher $H_k$ and lower $H_{ch}$ after hard axis annealing.

In addition, I have found that using $N_2O$ as the vehicle for delivering oxygen to the process is very beneficial from the standpoint of process control. In the prior art, $O_2$ is used to provide oxygen. The difficulty with $O_2$ is that it reacts with the target and metal coating in the deposition system. This reaction removes $O_2$ from the process gas. The amount of oxygen available for reaction with the film therefore depends on the prior condition of the entire chamber. Thus, reactive processes with oxygen are notoriously sensitive and difficult to control. I have found that using $N_2O$ or mixtures of $N_2$ and $N_2O$ as the reactive gas(es) avoids this problem since it does not react with the bare metal surfaces in the chamber. In my work, the process has been very repeatable, and has exhibited none of the hysteretic behavior that is typical of processes with $O_2$. Using $N_2O$ with Ar rather than $O_2$ with Ar as the reactive gas produces stable process behavior. This stability is a major advantage for a manufacturing process.

Figure 12:
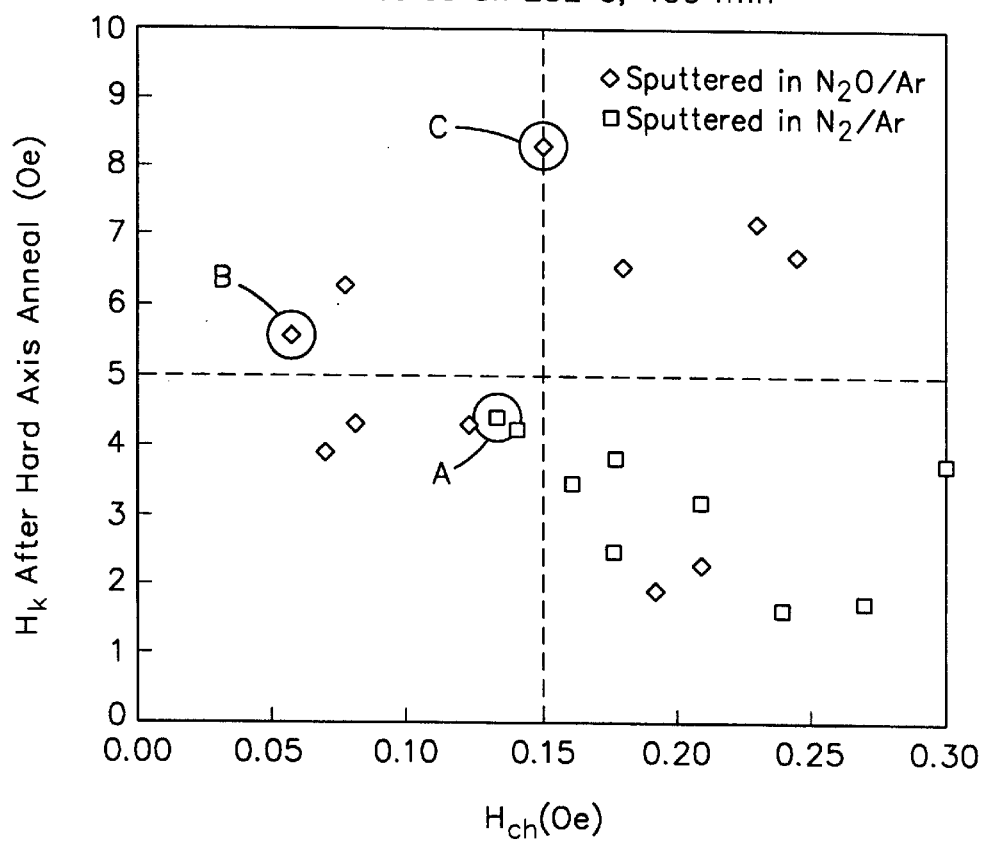
FIG. 12 illustrates the magnetic properties of laminated films of Fe—Al—N and Fe—Al—N—O deposited in a variety of process conditions.

FIG. 12 summarizes experiments performed with 2 different laminates sputtered $N_2O$/Ar and $N_2$/Ar. The first laminate was (18 Å alumina/1500 Å Fe—Al—N)$_{2x}$/25 Å alumina sputtered in $N_2$/Ar and the second laminate was (18 Å alumina/1000 Å Fe—Al—N—O)$_{3x}$/25 Å alumina sputtered in $N_2O$/Ar. All the films were deposited by RF magnetron sputtering from a Fe-2 at % Al (Fe$_{98}$Al$_2$) target on an Al$_2$O$_3$—TiC ceramic substrate in a Balzers Z660 system using $N_2O$ or $N_2$ in Ar as the reactive gas. After deposition, the films were annealed three times in an oven at 232° C. for 400 minutes, simulating two standard GMR hardbake cycles and a typical NiFe P2 annealing cycle. As can be generally seen in FIG. 12, the laminates sputtered in $N_2O$/Ar generally have a higher magnetic anisotropy, $H_k$ than those sputtered in $N_2$/Ar. Additionally, the laminates sputtered in $N_2O$/Ar generally have a lower $H_{ch}$ than those sputtered in $N_2$/Ar. Therefore, the more desirable laminates are located generally toward the upper left quadrant in FIG. 12.

Table 1 compares the best Fe—Al—N laminated film (film A in FIG. 12) and two of the best Fe—Al—N—O laminated films (films B and C in FIG. 12) that were obtained in a series of approximately 20 runs under various process conditions for each type of film. Films B and C have the same structure but use slightly different percentage of reactive gas in argon (Ar) during processing.

TABLE 1

Comparison of Magnetic Properties of Selected Fe—Al—N and Fe—Al—N—O Laminated Films Annealed on the Hard Axis 3× 232° C., 400 min

| | Process Conditions | | | | Magnetic Properties | | |
| | | | | | 3× Hard Axis Anneal | | |
| Structure | Power (W) | Press. (μbar) | Sub Bias V | Reactive Gas % in Ar | $H_k$ (Oe) | $H_{ch}$ (Oe) | $H_{ce}$ (Oe) |
| --- | --- | --- | --- | --- | --- | --- | --- |
| A: (18Å alumina/ 1500Å Fe—Al(2 at %)-N)$_{2x}$/ 25Å alumina = 3061 Å | 1750 | 7.0 | −5 | $N_2$, 2.0% | 4.4 | 0.13 | 0.67 |
| B: (18A alumina/ 1000Å Fe—Al(2 at %)-N—O)$_{3x}$/ 25Å alumina = 3079 Å | 1750 | 7.0 | −5 | $N_2O$, 3.0% | 5.6 | 0.06 | 0.29 |
| C: Same as above | 1750 | 7.0 | −5 | $N_2O$, 2.0% | 8.5 | 0.15 | 0.63 |

Figure 13:
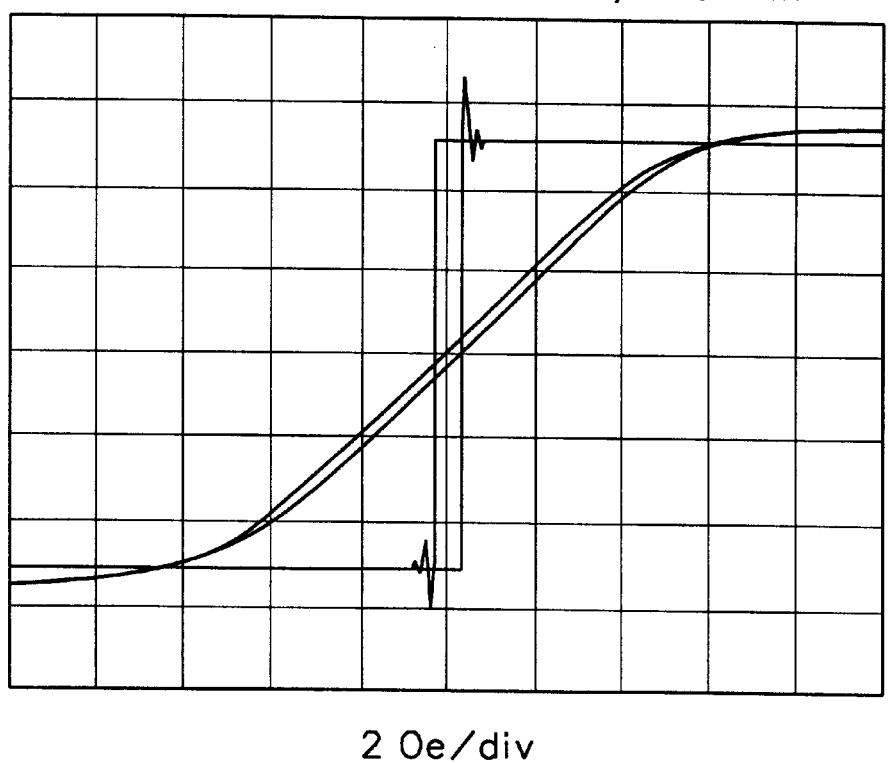
FIG. 13 shows the BH loops for Film B shown in FIG. 12.

It is apparent in Table 1 that the Fe—Al—N—O films (B and C) have higher magnetic anisotropy, $H_k$, than film A. In the case of film B, $H_k$ is somewhat higher (1.2 Oe higher than film A), but the $H_{ch}$ is about one-half (0.06 vs 0.13 Oe). In the case of film C, $H_k$ is nearly double film A (8.5 vs 4.4 Oe) while the $H_{ch}$ is only slightly higher (0.15 vs 0.13 Oe). The oxygen-containing films, Fe—Al—N—O (films B and C), clearly perform better in the hard axis anneals than the film containing only nitrogen, Fe—Al—N. FIG. 13 shows the BH loops for Film B in Table 1 after multiple hard axis anneals. Clearly, the film retains excellent magnetic anisotropy.

Figure 14:
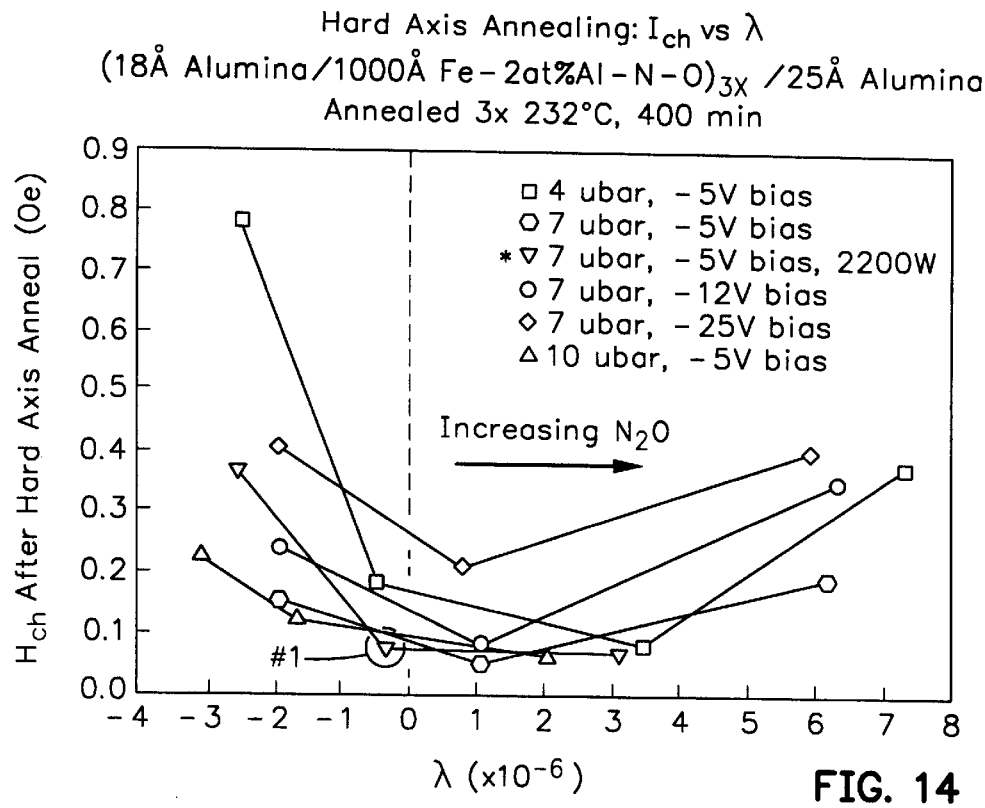
FIG. 14 shows the relationship between hard axis coercivity ($H_{ch}$) and magnetostriction ($\lambda$) in hard axis annealed Fe—Al—N—O laminated films made in various process conditions.
Figure 15:
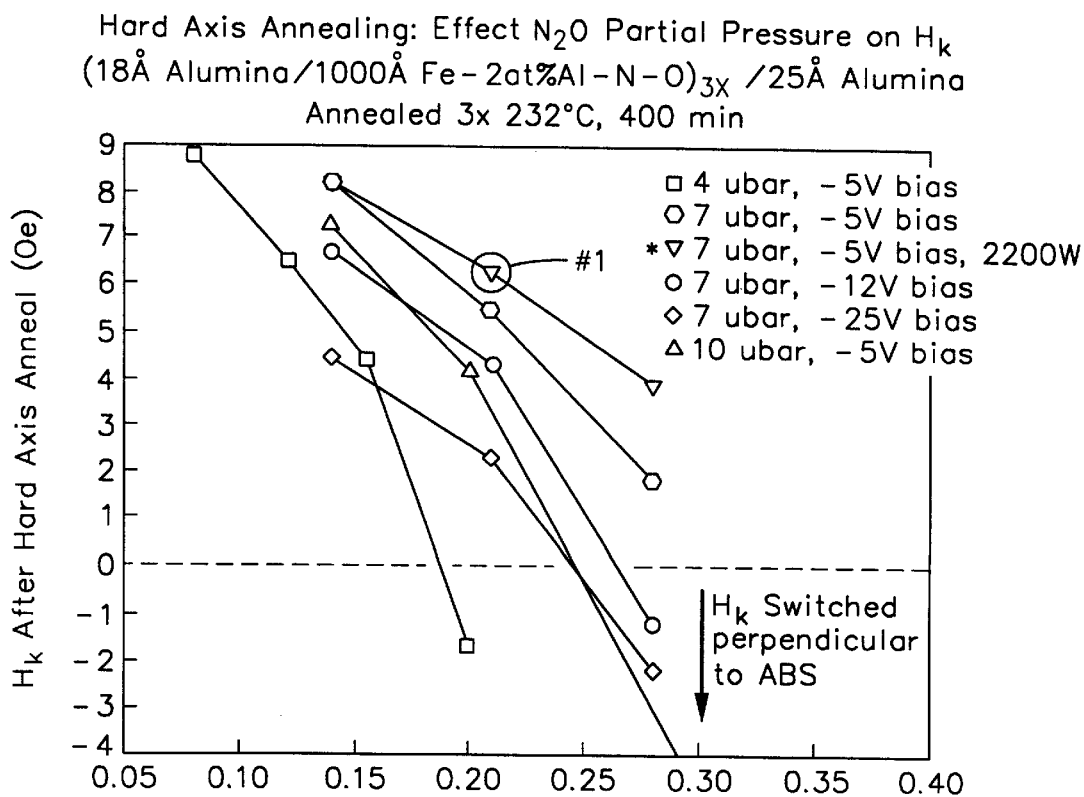
FIG. 15 shows the relationship between anisotropy field ($H_k$) and partial pressure $N_2O$ in the process gas in hard axis annealed Fe—Al—N—O laminated films made in various process conditions.
Figure 16:
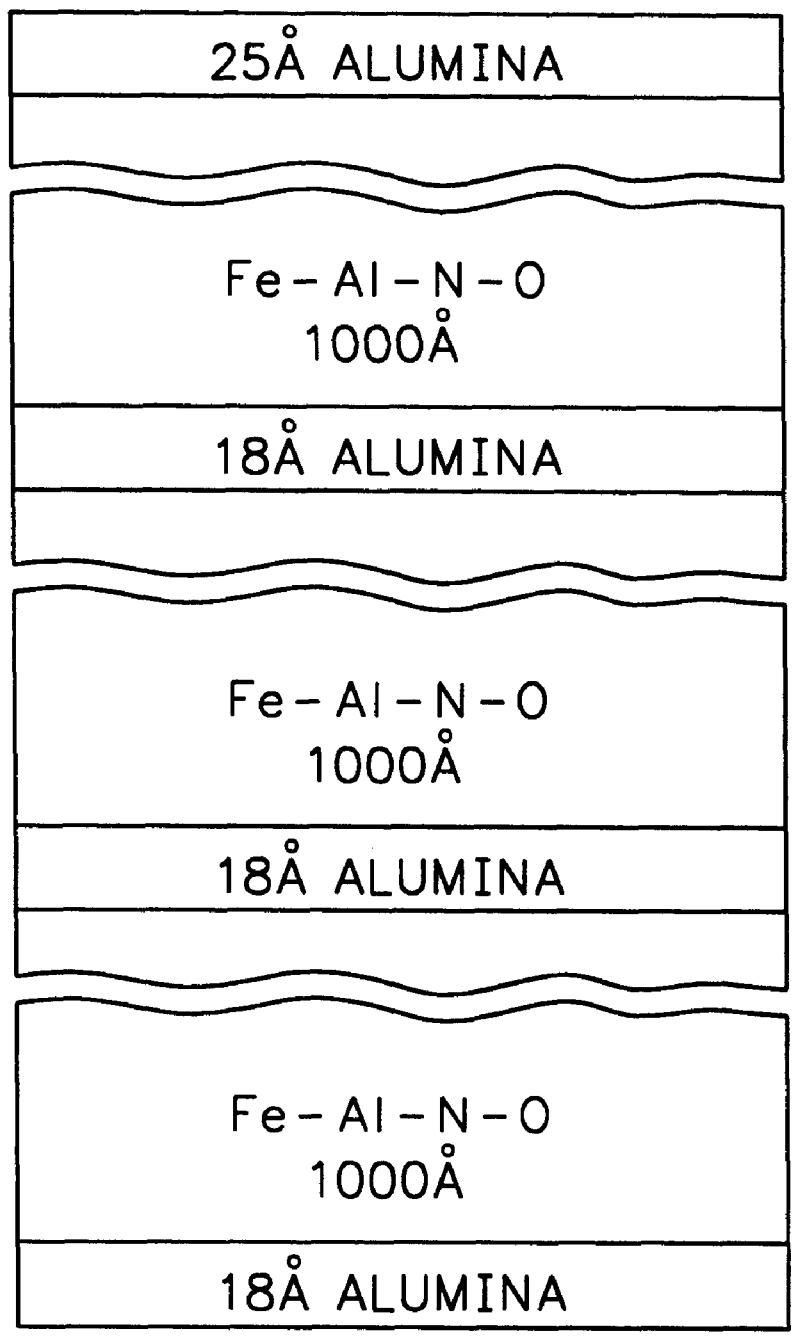
FIG. 16 shows the laminated film structure for the Fe—Al—N—O films in FIGS. 14 and 15.

FIGS. 14 and 15 show testing results of annealed Fe—Al—N—O laminate films with differing processing parameters. The structure of the test films was (18 Å alumina/1000 Å Fe—Al—N—O )$_{3x}$/25 Å alumina (see FIG. 16). All the films were deposited by RF magnetron sputtering (1750 W unless otherwise noted) from a Fe-2at % Al (Fe$_{98}$Al$_2$) target on an Al$_2$O$_3$—TiC ceramic substrate (−5V bias, −12V bias and −25V bias) in a Balzers Z660 system using $N_2O$/Ar gas (4 ubar, 7 ubar and 10 ubar). After deposition, the films were annealed three times in a Despatch oven at 232° C. for 400 minutes, simulating two standard GMR hardbake cycles and a typical NiFe annealing cycle. The desired laminate should have a high $H_k$, a low $H_{ch}$ and a λ near zero. Looking at FIG. 14, data point #1 has a relatively low $H_{ch}$ with λ near zero. The processing parameters were 7 ubar, −5V bias, 2200 W. In FIG. 15, point #1 has a relatively high $H_k$ with a $N_2O$ partial pressure of 0.21 ubar in the process gas. Therefore, the laminate made with the process parameters for point #1 would be the most desirable.

An exemplary shield or pole structure is (25 Å alumina/1000 Å Fe—Al—N—O)$_x$/25 Å alumina, were x may range from 1 to 30, with the preferred embodiment x=20 for a total thickness of 2.05 μm, and an exemplary bilayer P1 structure is

[1.5 µm NiFe/(25 Å A alumina/1000 Å Fe—Al—N—O)$_x$/25 Å alumina ], where x may range from 1 to 30, with the preferred embodiment x=3 and $Ni_{81}Fe_{19}$. While these show specific examples of shield or pole structures, it should be understood that materials other than alumina and $Ni_{81}Fe_{19}$ may be used.

Figure 17G:
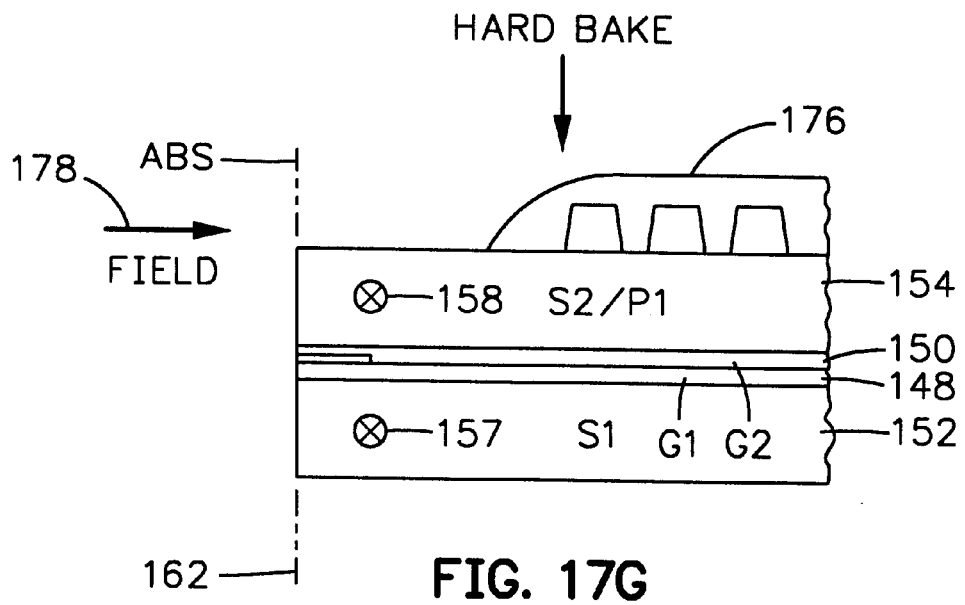
Figure 17H:
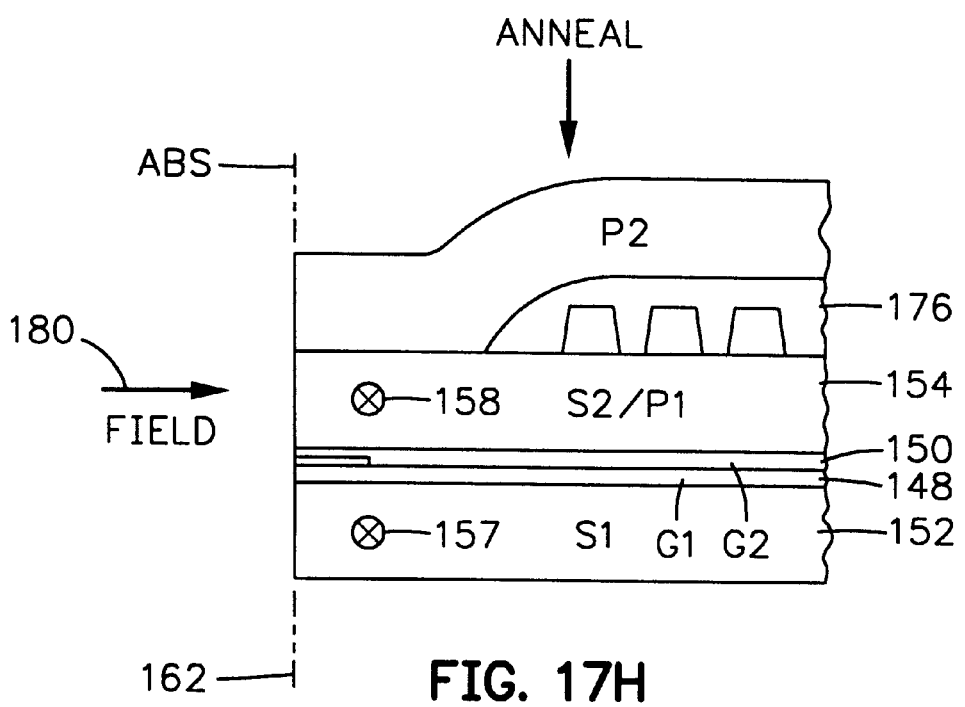

FIGS. 17A–17F illustrate the manufacture of the read head 72 with the Fe—Al—N—O shield layers showing various processing temperatures and fields exerted on the first and second shield layers 152 and 154. In FIG. 17A, the first shield layer 152 is sputtered in the presence of a field 160 of about 50 Oe that is directed parallel to the ABS 162 and in the plane of the first shield layer 152. This causes the easy axis 157 of the first shield layer 152 to be directed in the same direction, namely parallel to the ABS and parallel to the plane of the first shield layer 152. As shown in FIG. 17B, the first shield is then annealed at a temperature of about 270° C. for 2 hours in the presence of a field of about 1,500 Oe that is directed parallel to the ABS in the plane of the first shield layer. This increases the intrinsic anisotropy field ($H_K$) of the shield layer parallel to the ABS. As shown in FIG. 17C, after sputter depositing a non-magnetic electrically insulative first gap layer (G1) 148, a spin valve (SV) material layer 166 may be formed by sputtering in the presence of a field 168 that is directed perpendicular to the ABS 162. The field 168, which may be directed either to the right or to the left, is for the purpose of orienting the magnetic spins of the antiferromagnetic pinning layer 132 in FIG. 11 in a desired direction that pins the magnetic moment of the pinned layer 131 in FIG. 11 in the same direction. After deposition, the structure is annealed at a high temperature, such as 220° C., in the presence of a magnetic field of 13000 Oe that is oriented perpendicular to the ABS (FIG. 17D). Unfortunately, the step shown in FIG. 17D may reposition the orientation of the magnetic domains of the first shield layer 152, which will be discussed in more detail hereinafter. In FIG. 17E the spin valve layer 166 is photo-patterned and milled to provide a spin valve sensor 130. In FIG. 17F, after sputter depositing a non-magnetic insulative second gap layer 150, the second shield (S2 shown in FIG. 6) or second shield/first pole piece (S2/P1 in FIG. 7) layer 154 is formed by sputtering in the presence of a field 172 which is directed parallel to the ABS 162 and in the plane of the S2/P1 layer, such as into the paper as shown by x̂. This establishes the easy axis 158 of the second shield (S2 ) or second shield/first pole piece (S2/P1) layer 154 parallel to the ABS in the plane of the S2/P1 layer. This means that the magnetic domains of the second shield/first pole piece layer 154 will likewise be oriented parallel to the ABS. FIGS. 17G and 17H illustrate the manufacture of the write head 70 formed on top of read head 72 (as illustrated in FIG. 7 for a merged head). In FIG. 17G, various layers of the insulation stack 176 are hard baked at a high temperature, such as 230° C., in the presence of a field 178 of about 1500 Oe which is directed perpendicular to the ABS 162 for the purpose of maintaining the orientation of the magnetic spins of the pinning layer 132 in FIG. 11 directed perpendicular to the ABS. Unfortunately, this process may reorient the magnetic domains of the first and second shield layers 152 and 154, from their easy axis positions 157 and 158, which will be discussed in more detail hereinafter. In FIG. 17H, after completion of the magnetic head, the magnetic spins of the pinning layer 132 in FIG. 11 are reset by annealing at a high temperature of about 220° C. in the presence of a field 180 of about 13,000 Oe which is again directed perpendicular to the ABS 162. Again, this processing step may reorient the magnetic domains of the shield layers from the easy axes 157 and 158, which will be described in more detail hereinafter. It should be noted that if the magnetic domains aligned along the easy axes 157 and 158 are moved from their aligned positions they will be magnetically unstable to applied fields during the operation of the head.

Figure 18:
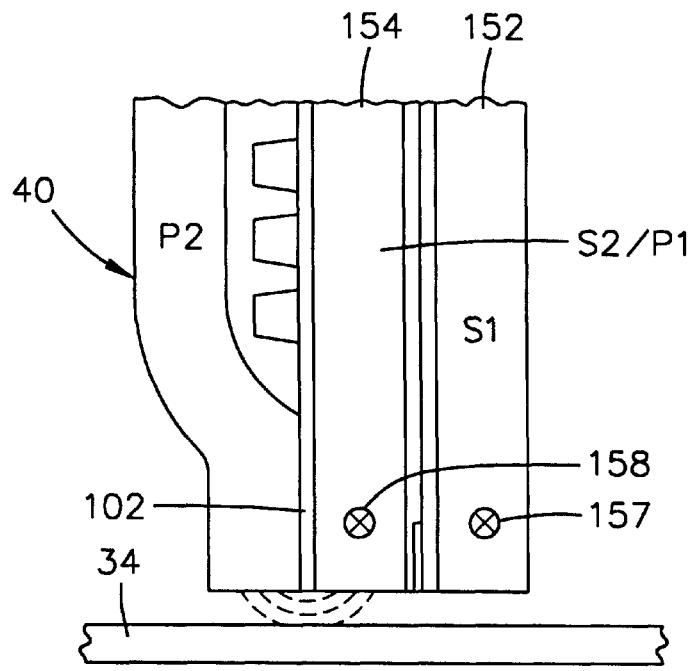
FIG. 18 is an elevation view of a portion of a merged MR head writing signals into a rotating magnetic disk.
Figure 19:
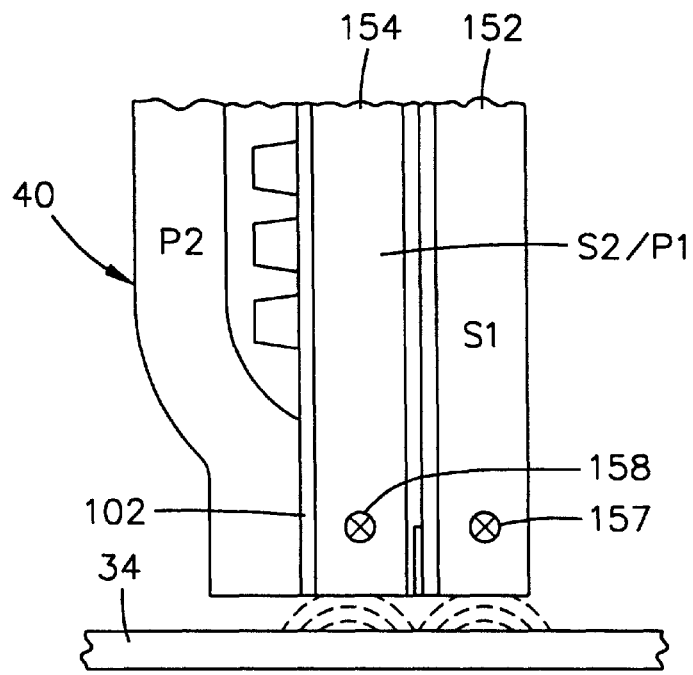
FIG. 19 is the same as FIG. 19 except the disk is injecting magnetic signals into the magnetic head.

FIG. 18 shows magnetic flux fringing across the gap layer 102 of the write head portion of the magnetic head 40. This flux can move the magnetic domains of the first and second shield layers 152 and 154 to various positions if the magnetic domains are not aligned along the easy axes 157 and 158. In the same manner, as shown in FIG. 19, magnetic fields from the rotating magnetic disk 34 may move the magnetic domains of the first and second shield layers 152 and 154 if the magnetic domains are not aligned along the easy axes 157 and 158. If the magnetic domains of either of the layers 152 and 154 move around during operation of the head, this will cause what is known in the art as Barkhausen noise which seriously interferes with the read signal of the read head portion of the magnetic head.

Figure 20A:
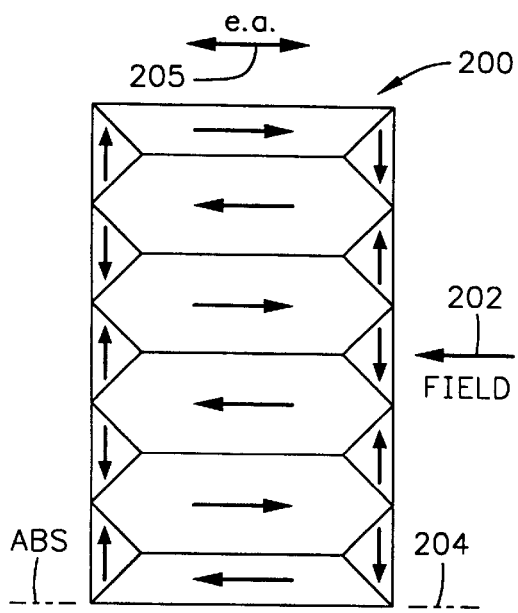
FIGS. 20A–20C are plan views of the prior art shield or pole piece layer of the magnetic head with magnetic domains shown schematically in various conditions.
Figure 20B:
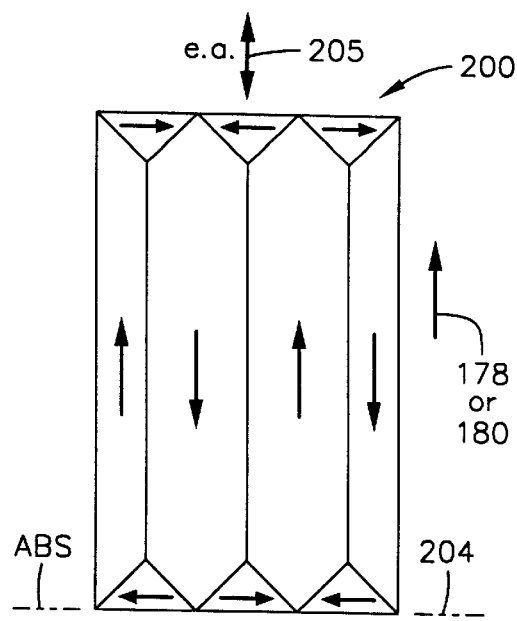
Figure 20C:
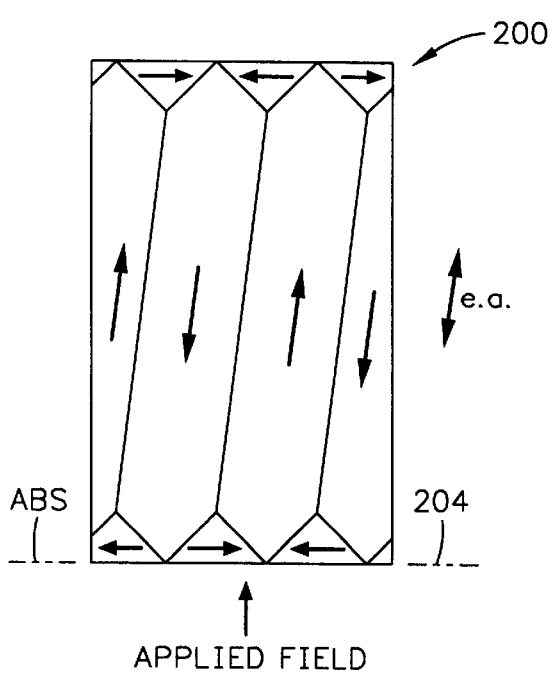

FIGS. 20A–20C show magnetic domain configurations for prior art material, such as NiFe, used for first and second shield layers. In FIG. 20A, a prior art shield material is plated or sputter deposited in the presence of a field 202 which is directed parallel to the ABS 204 in the plane of the layer. This causes the magnetic domains, which are elongated diamonds, to align with their longitudinal axes parallel to the field 202 and with an easy axis 205. The shield layer is then subjected to annealing at a temperature of 230° C. for 2 hours in the presence of a field of 1,500 Oe directed parallel to the ABS in the plane of the shield layer. In FIG. 20B, the first or second shield layer 200 is subjected to hard baking of the insulation layers of the write head in the presence of a field 178 perpendicular to the ABS, as shown in FIG. 17G, or subjected to annealing in the presence of a field 180 to orient the magnetic spins of the pinning layer 132 in FIG. 11. The annealing reduces the intrinsic magnetic anisotropy ($H_K$) of the first or second shield layer. In conjunction with an unfavorable stress induced anisotropy field, this can cause the magnetic domains to switch their positions from parallel to the ABS, as shown in FIG. 20A, to perpendicular to the ABS, as shown in FIG. 20B. Unfortunately, this is a very unstable position for magnetic domains when they encounter applied fields during the operation of the head. In FIG. 20C a write field, such as 200 Oe, or a disk field, such as 50 Oe, is applied to the first or second shield layer 200 which causes the magnetic domains to move from their position perpendicular to the ABS. This movement causes Barkhausen noise which is a problem obviated by the present invention. Accordingly, it is important that the intrinsic anisotropy ($H_K$) of the shield be higher so that even after annealing in a field perpendicular to the ABS, the shield retains sufficient anisotropy field ($H_K$). Alternatively, the shield material may become isotropic, thereby losing its intrinsic anisotropy ($H_K$).

FIGS. 21A–21D illustrate plan views of a first or second shield layer 300 of the present invention wherein the magnetic domains are not destabilized by subsequent processing steps nor are they moved by applied fields during operation of the head. This is accomplished by employing a Fe—Al—N—O material, which is preferably Fe-2 at. % Al—N—O alloy.

Figure 21A:
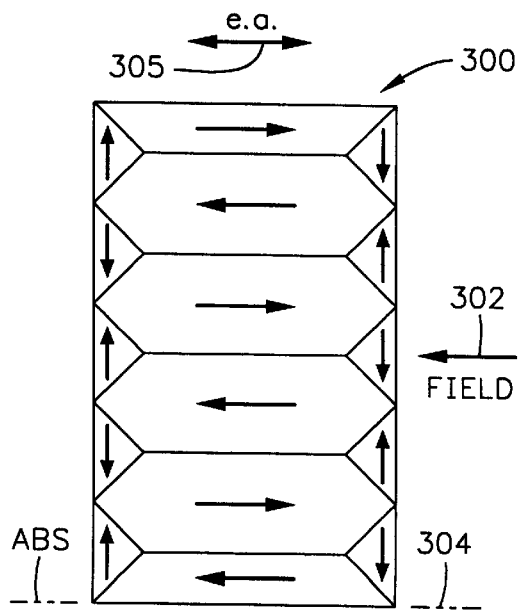
FIGS. 21A–21D are plan views of a shield or pole piece layer of a magnetic head with magnetic domains shown schematically under various applied field conditions.
Figure 21B:
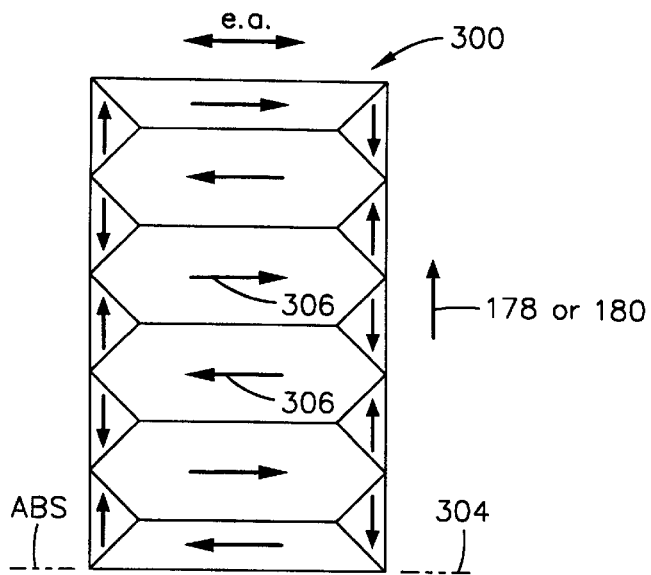
Figure 21C:
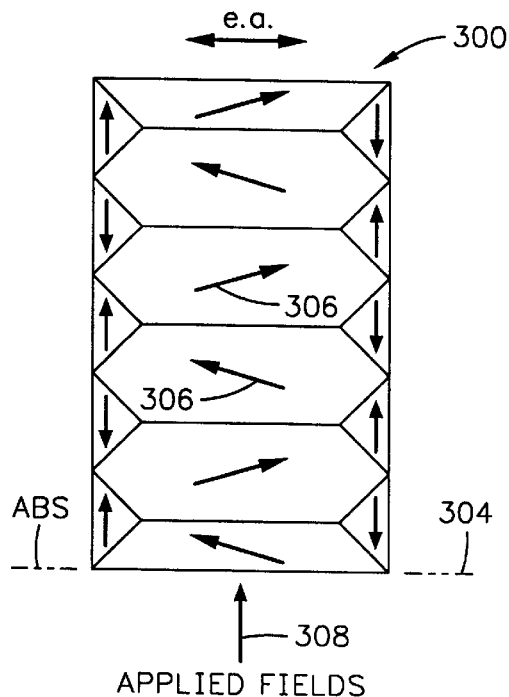
Figure 21D:
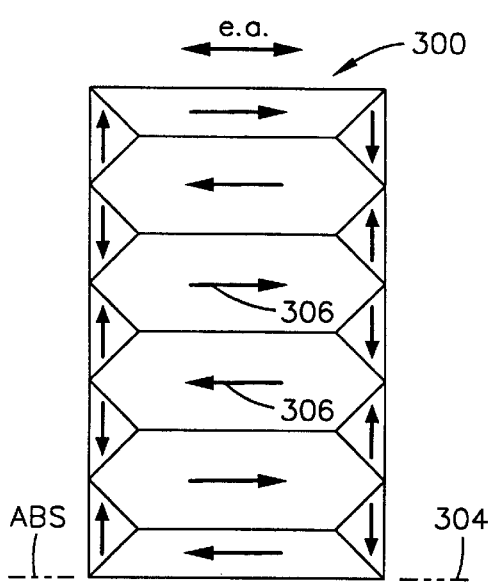

In FIG. 21A the first and/or second shield layer 300 is constructed of the Fe—Al—N—O material. It may be sputter deposited in the presence of a field 302 which is parallel to the ABS 304 and the plane of the shield layer. This establishes the easy axis 305 parallel to the ABS and the longitudinal axes of the magnetic domains parallel to the ABS as shown. In the case of a first shield layer, it may also be annealed with the same field as described in reference to FIG. 17A. It is desirable that this orientation of the magnetic domains be retained during subsequent construction and operation of the head. In FIG. 21B the layer 300 has been subjected to hard baking and a field 178, as shown in FIG. 17G, or to annealing in the presence of a field 180 for resetting, as shown in FIG. 17H. Since the intrinsic anisotropy ($H_K$) of the Fe—Al—N—O material is higher, the shield can tolerate a greater loss of anisotropy during annealing and still retain sufficient intrinsic anisotropy to maintain the domains parallel to the ABS, even in the presence of possibly unfavorable stress induced anisotropy. In FIG. 21C, the layer 300 is subjected to applied fields from the write head or from the disk as shown in FIGS. 18 and 19 which will cause the magnetic moments 306 to rotate as shown. However, the magnetic domains retain their parallel orientation. Upon the removal of the operational applied fields 308 the magnetic moments 306 return to their parallel orientations, as shown in FIG. 21D. Accordingly, after construction of the first shield and/or second shield/first pole piece layer 300, as shown in FIG. 21A, the magnetic domains are not reoriented during the processing steps in FIG. 21B and do not move during operation of the head as shown in FIG. 21C. This results in the elimination of the aforementioned Barkhausen noise which degrades the performance of the read head.

Figure 22:
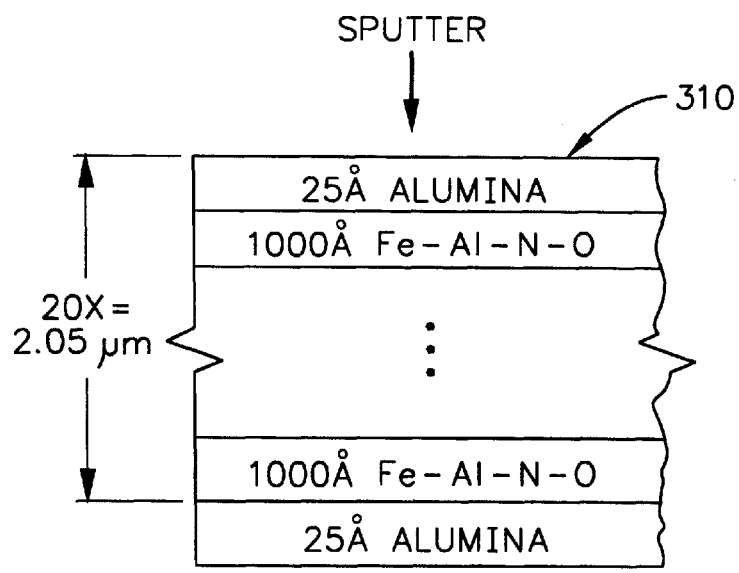
FIG. 22 is an elevation view of a portion of the shield or pole layer showing various layers of materials used for construction.
Figure 23:
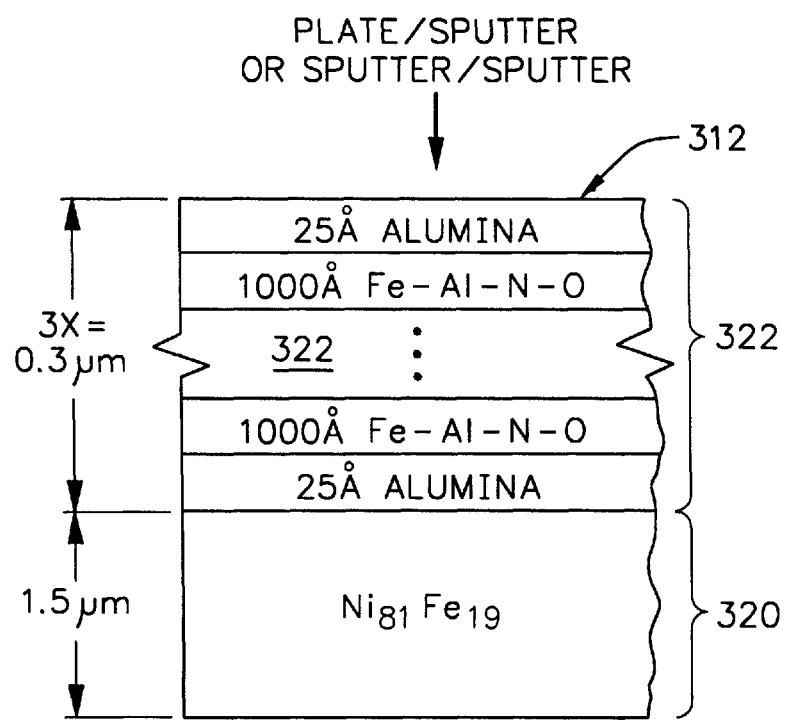
FIG. 23 is an elevation view of a portion of the shield or pole piece layer showing another embodiment of layers of materials in construction.

FIGS. 22 and 23 show specific embodiments which may be employed for the shield or pole piece layer 310. FIG. 22 shows one embodiment of a laminate of Fe—Al—N—O material and alumina that is sputter deposited with an exemplary thickness of 2.05, $\mu$m. This may be accomplished by employing layers of 25 Å alumina/1000 Å Fe—Al—N—O 20 times with a 25 Å thick alumina coating which is a 2.05 $\mu$m magnetic thickness of the layer. FIG. 23 shows another embodiment of materials for the shield or pole piece layer 312 which includes first and second layers 320 and 322. The first layer 320 may be a nickel iron material such as $Ni_{81}Fe_{19}$, that is plated or sputtered to a thickness such as 1.5 $\mu$m. The second layer 322 is a sputtered laminate of a high magnetic moment material, such as Fe—Al—N—O, laminated with layers of alumina. The Fe—Al—N—O layers may be 1000 Å thick and the alumina layers may be 25 Å thick. If this laminate is repeated 3 times the magnetic thickness of the second layer 322 is 0.3 $\mu$m giving a total magnetic thickness of 1.8 $\mu$m.

Clearly, other embodiments and modifications of this invention will occur readily to those of ordinary skill in the art in view of these teachings. For instance, the spin valve sensor may be employed for purposes other than a magnetic disk drive, such as a tape drive, search and surveillance devices and laboratory equipment. Therefore, this invention is to be limited only by following claims, which include all such embodiments and modifications when viewed in conjunction with the above specification and accompanying drawings.

I claim:

1. A method of making a magnetic head that has an air bearing surface (ABS), comprising:
    forming a read head;
    forming a ferromagnetic first shield layer;
    forming a nonmagnetic electrically insulative first gap layer on the first shield layer;
    forming a read sensor and first and second lead layers connected to the read sensor on the first gap layer;
    forming a nonmagnetic electrically insulative second gap layer on the read sensor, the first and second lead layers and the first gap layer;
    forming a ferromagnetic second shield layer on the second gap layer;
    at least one of the shield layers comprises a laminated film which includes at least one Fe—Al—N—O layer and at least one nonmagnetic layer; and
    said at least one Fe—Al—N—O layer being formed by sputtering with $N_2O$ as a reactive gas.

2. A method as claimed in claim 1 wherein said at least one of the shield layers has an easy axis parallel to the ABS.

3. A method as claimed in claim 1 wherein said at least one nonmagnetic layer is at least one alumina layer.

4. A method as claimed in claim 3 wherein said at least one alumina layer is 25 Å thick and said at least one Fe—Al—N—O layer is 1000 Å thick.

5. A method as claimed in claim 1 wherein the second shield layer also serves as a first pole piece layer for a write head and has a yoke region between pole tip and back gap regions, the method including:
    forming a nonmagnetic electrically insulative write gap layer on the first pole piece layer in the pole tip region;
    forming an insulation stack with at least one coil layer embedded therein on the first pole piece layer in the yoke region; and
    forming a second pole piece layer on the write gap layer and the insulation stack, the second pole piece layer being connected to the first pole piece layer in said back gap region.

6. A method as claimed in claim 5 wherein said at least one shield layer is said second shield layer/first pole piece layer which is formed comprising the steps of:
    forming a NiFe layer;
    forming said at least one nonmagnetic layer on the NiFe layer; and
    forming said at least one Fe—Al—N—O layer on the nonmagnetic layer.

7. A method as claimed in claim 6 wherein said at least one Fe—Al—N—O layer has an easy axis parallel to the ABS.

8. A method as claimed in claim 7 wherein said at least one nonmagnetic layer is at least one alumina layer.

9. A method as claimed in claim 8 wherein said at least one alumina layer is 25 Å thick, said at least one Fe—Al—N—O layer is 1000 Å thick and the NiFe layer is 1.5 $\mu$m thick.

10. A method as claimed in claim 5 wherein the second pole piece layer comprises a laminated film including at least one Fe—Al—N—O layer and at least one nonmagnetic layer.

11. A method as claimed in claim 10 wherein the Fe—Al—N—O laminated film has an easy axis parallel to the ABS.

12. A method as claimed in claim 11 wherein said at least one nonmagnetic layer is at least one alumina layer.

13. A method as claimed in claim 12 wherein said at least one alumina layer is 25 Å thick and said at least one Fe—Al—N—O layer is 1000 Å thick.

14. A method as claimed in claim 1 further comprising:
    forming a write head on the read head, the write head having a yoke region between a pole tip region and a back gap region, the method including:
        forming a nonmagnetic electrically insulative layer on the second shield layer;
        forming a first pole piece layer on the insulative layer;
        forming a nonmagnetic electrically insulative write gap layer on the first pole piece layer in the pole tip region;

forming an insulation stack with at least one coil layer embedded therein on the first pole piece layer in the yoke region; and forming a second pole piece layer on the write gap layer, the insulation stack and connected to the first pole piece layer in said back gap region.

15. A method as claimed in claim 14 further wherein at least one of said first or second pole piece layers comprises a laminated film which includes at least one Fe—Al—N—O layer and at least one nonmagnetic layer.

16. A method as claimed in claim 14 wherein at least one pole piece layer is said second pole piece layer and has an easy axis parallel to the ABS.

17. A method as claimed in claim 16 wherein said at least one nonmagnetic layer is at least one alumina layer.

18. A method as claimed in claim 17 wherein said at least one alumina layer is 25 Å thick and said Fe—Al—N—O layer is 1000 Å thick.

19. A method as claimed in claim 18 wherein said second pole piece layer is formed comprising the steps of:

forming a NiFe layer;

forming the alumina layer on the NiFe layer; and forming the Fe—Al—N—O layer on the alumina layer.

20. A method as claimed in claim 19 wherein the NiFe layer is 1.5 μm thick.

21. A method as claimed in claim 1 wherein sputtering is done with a partial pressure of $N_2O$ from 0.1 to 0.25 μbar and with a bias from −5 volts to −12 volts.

22. A method as claimed in claim 21 wherein the sputtering is magnetron sputtering with a power of at least 1750 watts.

23. A method as claimed in claim 22 wherein the partial pressure of $N_2O$ is 0.21 μbar and the bias is −5 volts.

24. A method as claimed in claim 23 wherein the power is 2200 watts.

\* \* \* \* \*